(12) United States Patent
Park

(10) Patent No.: US 9,721,830 B2
(45) Date of Patent: Aug. 1, 2017

(54) METHODS OF MANUFACTURING SEMICONDUCTOR DEVICES INCLUDING ISOLATION LAYERS

(71) Applicant: Samsung Electronics Co., Ltd., Suwon-si (KR)

(72) Inventor: Seok-Han Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/148,282

(22) Filed: May 6, 2016

(65) Prior Publication Data

US 2017/0018453 A1    Jan. 19, 2017

(30) Foreign Application Priority Data

Jul. 16, 2015  (KR) .......................... 10-2015-0100811

(51) Int. Cl.

| | |
|---|---|
| *H01L 21/00* | (2006.01) |
| *H01L 21/762* | (2006.01) |
| *H01L 21/3105* | (2006.01) |
| *H01L 21/02* | (2006.01) |
| *H01L 29/06* | (2006.01) |
| *H01L 27/108* | (2006.01) |

(52) U.S. Cl.
CPC .... *H01L 21/76224* (2013.01); *H01L 21/0223* (2013.01); *H01L 21/02142* (2013.01); *H01L 21/02164* (2013.01); *H01L 21/02318* (2013.01); *H01L 21/31051* (2013.01); *H01L 27/10814* (2013.01); *H01L 27/10817* (2013.01); *H01L 27/10823* (2013.01); *H01L 27/10847* (2013.01); *H01L 27/10897* (2013.01); *H01L 29/0642* (2013.01)

(58) Field of Classification Search
CPC ......... H01L 21/76224; H01L 21/02142; H01L 21/02164; H01L 21/0223; H01L 21/31051; H01L 21/02318; H01L 27/10814; H01L 27/10817; H01L 27/10823; H01L 27/10847; H01L 27/10897; H01L 29/0642
See application file for complete search history.

(56) References Cited

U.S. PATENT DOCUMENTS

| 6,383,951 | B1* | 5/2002 | Li ........................ C23C 16/30 |
| | | | 257/E21.279 |
| 6,919,260 | B1 | 7/2005 | Umezawa et al. |
| 8,530,330 | B2 | 9/2013 | Ahn et al. |

(Continued)

FOREIGN PATENT DOCUMENTS

| JP | 2011181683 | 9/2011 |
| JP | 2012134302 | 7/2012 |

(Continued)

*Primary Examiner* — Nicholas Tobergte
(74) *Attorney, Agent, or Firm* — Onello & Mello, LLP

(57) ABSTRACT

A method of manufacturing a semiconductor device comprising the steps of: forming a trench at an upper portion of a semiconductor substrate forming a preliminary filling insulation layer by coating a siloxane composition on the semiconductor substrate to fill the trench performing a low temperature curing process at a temperature in a range from about 50° C. to about 150° C. such that the preliminary filling insulation layer is transformed into a filling insulation layer including polysiloxane and forming an isolation layer by planarizing the filling insulation layer.

14 Claims, 17 Drawing Sheets

(56) References Cited

U.S. PATENT DOCUMENTS

| | | | |
|---|---|---|---|
| 8,975,196 B2 | 3/2015 | Nakazawa | |
| 2005/0101157 A1* | 5/2005 | Yunogami | H01L 21/02126 438/781 |
| 2005/0121327 A1* | 6/2005 | Chen | C23C 18/1893 205/91 |
| 2010/0001328 A1* | 1/2010 | Yang | H01L 24/03 257/296 |
| 2011/0081765 A1* | 4/2011 | Cummings | H01L 21/76229 438/424 |
| 2012/0100298 A1* | 4/2012 | Moriyama | C08L 83/04 427/385.5 |
| 2014/0312409 A1 | 10/2014 | Thurgate et al. | |
| 2015/0206963 A1* | 7/2015 | Ho | H01L 21/31111 257/411 |

FOREIGN PATENT DOCUMENTS

| | | |
|---|---|---|
| JP | 2014072252 | 4/2014 |
| KR | 1020090022227 | 3/2009 |
| KR | 0898580 | 5/2009 |

\* cited by examiner

METHODS OF MANUFACTURING SEMICONDUCTOR DEVICES INCLUDING ISOLATION LAYERS

CROSS-REFERENCE TO RELATED APPLICATION

This application claims priority under 35 USC §119 to Korean Patent Application No. 10-2015-0100811, filed on Jul. 16, 2015 in the Korean Intellectual Property Office (KIPO), the contents of which are incorporated by reference herein in their entirety.

FIELD

Exemplary embodiments relate to methods of manufacturing semiconductor devices including isolation layers. More particularly, exemplary embodiments relate to methods of manufacturing semiconductor devices including oxide-based isolation layers.

BACKGROUND

An isolation layer may be formed to define an active region and a field region in a semiconductor device. For example, a trench may be formed at an upper portion of a semiconductor substrate, and an insulation layer filling the trench may be formed on the semiconductor substrate. A thermal treatment and a polishing process may be performed on the insulation layer to form the isolation layer.

However, various processes performed with respect to the insulation layer may cause chemical, mechanical and/or electrical defects in the resulting semiconductor substrate.

SUMMARY

Exemplary embodiments provide methods of manufacturing a semiconductor device having improved mechanical and electrical reliability.

According to exemplary embodiments, there is provided a method of manufacturing a semiconductor device. In the method, a trench may be formed at an upper portion of a semiconductor substrate. A preliminary filling insulation layer may be formed by coating a siloxane composition on the semiconductor substrate to fill the trench. A low temperature curing process may be performed at a temperature in a range from about 50° C. to about 150° C. such that the preliminary filling insulation layer may be transformed into a filling insulation layer including polysiloxane. An isolation layer may be formed by planarizing the filling insulation layer.

In exemplary embodiments, an oxide liner may be further formed on an inner wall of the trench.

In exemplary embodiments, in forming the preliminary filling insulation layer, the siloxane composition may be coated directly on the oxide liner on an inner wall of the trench.

In exemplary embodiments, the trench may include a first trench and a second trench. The second trench may have a second trench width greater than a first trench width of the first trench. The oxide liner may fully fill the first trench, and may extend along an inner wall profile of the second trench.

In exemplary embodiments, the substrate may include a device region and a peripheral circuit region. The first trench may be formed at the device region and the second trench may be formed at the peripheral circuit region.

In exemplary embodiments, the siloxane composition may include a siloxane oligomer containing silicon-oxygen (Si—O) bonds.

In exemplary embodiments, the siloxane oligomer may be devoid of silicon-nitrogen (Si—N) bonds.

In exemplary embodiments, the low temperature curing process may be performed at a temperature in a range from about 50° C. to about 150° C., in some embodiments from about 50° C. to about 100° C.

In exemplary embodiments, after forming an isolation layer, at least an upper portion of the isolation layer may be transformed into a modified isolation layer by a dry oxidation process.

In exemplary embodiments, the dry oxidation process may include a plasma treatment or an ultraviolet treatment performed in an atmosphere devoid of a water vapor ($H_2O$).

According to exemplary embodiments, there is provided a method of manufacturing a semiconductor device. In the method, a trench may be formed at an upper portion of a semiconductor substrate. A filling insulation layer that may fill the trench and include polysiloxane may be formed. An isolation layer may be formed by planarizing the filling insulation layer. A dry oxidation process may be performed on at least an upper portion of the isolation layer.

In exemplary embodiments, the dry oxidation process may include a plasma treatment or an ultraviolet treatment performed in an atmosphere devoid of water vapor ($H_2O$).

In exemplary embodiments, in forming the filling insulation layer, a preliminary filling insulation layer that may fill the trench and include a siloxane oligomer or a siloxane prepolymer may be formed. A low temperature curing process may then be performed at a temperature in a range from about 50° C. to about 150° C.

In exemplary embodiments, an oxide liner may be formed on an inner wall of the trench. The filling insulation layer and the isolation layer may be formed directly on the oxide liner.

In exemplary embodiments, in performing the dry oxidation process, at least an upper portion of the isolation layer may be transformed into a modified isolation layer having a silicate structure.

In exemplary embodiments, an active pattern may be defined from the semiconductor substrate by the isolation layer. A gate structure may be formed on the active pattern. An impurity region may be formed at an upper portion of the active pattern adjacent to the gate structure.

In exemplary embodiments, a capacitor electrically connected to the impurity region may be further formed on the substrate, as previously described.

According to exemplary embodiments, there is provided a method of manufacturing a semiconductor device. In the method, a trench may be formed at an upper portion of a semiconductor substrate. An oxide liner may be formed on an inner wall of the trench. A siloxane composition may be coated on the oxide liner to form a preliminary filling insulation layer filling the trench. The preliminary filling insulation layer may be cured at a temperature below about 100° C. to form a cured filling insulation layer including polysiloxane. The cured filling insulation layer may then be planarized to form an isolation layer. At least an upper portion of the isolation layer may be oxidized by a dry oxidation process.

In exemplary embodiments, in forming the trench, a mask pattern may be formed on the semiconductor substrate. An upper portion of the semiconductor substrate may be etched using the mask pattern. The filling insulation layer may be planarized until a top surface of the mask pattern may be exposed.

In exemplary embodiments, after the dry oxidation process, the mask pattern may be removed.

In an aspect, a method of manufacturing a semiconductor device comprises the steps of: forming a trench at an upper portion of a semiconductor substrate; forming a preliminary filling insulation layer by coating a siloxane composition on the semiconductor substrate to fill the trench; performing a low temperature curing process at a temperature in a range from about 50° C. to about 150° C. such that the preliminary filling insulation layer is transformed into a cured filling insulation layer including polysiloxane; and forming an isolation layer by planarizing the cured filling insulation layer.

In some embodiments, the method further comprises a step of forming an oxide liner on an inner wall of the trench before filling the trench with the insulation layer.

In some embodiments, the step of forming the preliminary filling insulation layer includes coating the siloxane composition directly on the oxide liner.

In some embodiments, the step of forming the trench includes forming a first trench and a second trench, the second trench having a second trench width greater than a first trench width of the first trench, and also forming the oxide liner so that it fully fills the first trench and extends along an inner wall profile of the second trench.

In some embodiments, the substrate includes a device region and a peripheral circuit region, and the first trench is formed at the device region and the second trench is formed at the peripheral circuit region.

In some embodiments, the siloxane composition includes a siloxane oligomer containing silicon-oxygen (Si—O) bonds.

In some embodiments, the siloxane oligomer is substantially devoid of silicon-nitrogen (Si—N) bonds.

In some embodiments, the low temperature curing process is performed at a temperature in a range from about 50° C. to about 100° C.

In some embodiments, after the step of forming the isolation layer, the method further comprises: transforming at least an upper portion of the isolation layer into a modified isolation layer having a silicate structure by a dry oxidation process.

In some embodiments, the dry oxidation process includes a plasma treatment or an ultraviolet treatment performed in an atmosphere substantially devoid of water vapor ($H_2O$).

In an aspect, a method of manufacturing a semiconductor device comprises: forming a trench at an upper portion of a semiconductor substrate; forming a polysiloxane filling insulation layer that fills the trench and includes polysiloxane; forming an isolation layer by planarizing the polysiloxane filling insulation layer; and performing a dry oxidation process on at least an upper portion of the isolation layer.

In some embodiments, the dry oxidation process includes a plasma treatment or an ultraviolet treatment performed in an atmosphere substantially devoid of water vapor ($H_2O$).

In some embodiments, the step of forming the polysiloxane filling insulation layer includes: forming a preliminary filling insulation layer that fills the trench and includes a siloxane oligomer or a siloxane prepolymer; and performing a low temperature curing process at a temperature in a range from about 50° C. to about 150° C.

In some embodiments, the method further comprises a step of forming an oxide liner on an inner wall of the trench before filling the trench with the insulation layer, and also comprises forming the filling insulation layer and the isolation layer directly on the oxide liner.

In some embodiments, the step of performing the dry oxidation process includes transforming at least the upper portion of the isolation layer into a modified isolation layer having a silicate structure.

In an aspect, a semiconductor device comprises at least an isolation structure defined by a filled trench at an upper portion of a semiconductor substrate, wherein the trench is substantially filled with a planarized layer of a polysiloxane insulation material that is substantially free of any silicon-nitride (Si—N) bonds.

In some embodiments, the trench has an oxide liner that is substantially free of any silicon-nitride (Si—N) bonds conformally formed along an inner wall of the trench, and the polysiloxane insulation layer is formed directly on the oxide liner.

In some embodiments, the semiconductor substrate has a first active region with a first trench having a first trench width, a second active region with a second trench having a second trench width that is greater than the first trench width, and also the oxide liner substantially fills the first trench and extends conformally along the inner wall of the second trench, which is otherwise filled with the polysiloxane layer.

In some embodiments, at least an upper portion of the polysiloxane insulation layer in the trench comprises a silicate structure.

In some embodiments, a plurality of trenches defines a plurality of isolation structures, and transistor structures and/or capacitor structures are formed on the isolation structures to form a dynamic random access (DRAM) device.

BRIEF DESCRIPTION OF THE DRAWINGS

Exemplary embodiments will be more clearly understood from the following detailed description taken in conjunction with the accompanying drawings. FIGS. 1 to 28 represent non-limiting, exemplary embodiments as described herein.

FIGS. 1 to 8 are schematic cross-sectional views illustrating a method of manufacturing a semiconductor device in accordance with exemplary embodiments;

FIGS. 9 to 11 are schematic cross-sectional views illustrating a method of manufacturing a semiconductor device in accordance with some exemplary embodiments;

FIGS. 12 to 16, FIGS. 17A and 17B, and FIGS. 18A and 18B are schematic cross-sectional views illustrating a method of manufacturing a semiconductor device in accordance with exemplary embodiments; and FIGS. 19 to 28 are a schematic top plan view and schematic cross-sectional views illustrating a method of manufacturing a semiconductor device in accordance with exemplary embodiments.

DESCRIPTION OF EMBODIMENTS

Figure 1:
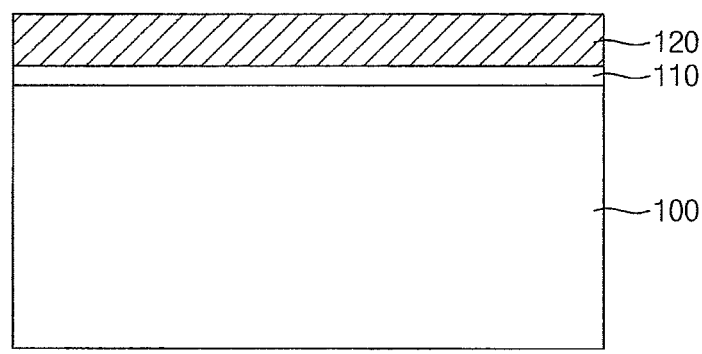

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, for example, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then instead be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations in the shapes of the illustrations as a result, for example, of manufacturing techniques and/or tolerances, are to be expected. Thus, exemplary embodiments should not be construed as limited to the particular shapes of regions illustrated herein but are to include variations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not necessarily intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIGS. 1 to 8 are cross-sectional views illustrating a method of manufacturing a semiconductor device in accordance with exemplary embodiments. For example, FIGS. 1 to 8 illustrate a method of manufacturing a semiconductor device including a shallow trench isolation (STI) process.

Referring to FIG. 1, a mask layer 120 may be formed on a substrate 100. In some embodiments (as illustrated in FIG. 1), a pad oxide layer 110 may be formed on the substrate 100, and then the mask layer 120 may be formed on the pad oxide layer 110.

A semiconductor substrate, e.g., a silicon substrate, a germanium substrate or a silicon-germanium substrate may be utilized as the substrate 100. In some embodiments, a silicon-on-insulator (SOI) substrate or a germanium-on-insulator (GOD substrate may be used as the substrate 100. The substrate 100 may include a group III-V compound, e.g., InP, GaP, GaAs, GaSb, or the like. P-type or n-type impurities may be implanted at an upper portion of the substrate 100 to form a well.

The pad oxide layer 110 and the mask layer 120 may be formed of silicon oxide and silicon nitride, respectively. The pad oxide layer 110 and the mask layer 120 may be formed by a chemical vapor deposition (CVD) process, a sputtering process, an atomic layer deposition (ALD) process, a physical vapor deposition (PVD) process, etc. In some embodiments, the pad oxide layer 110 may be formed by a thermal oxidation process on a top surface of the substrate 100.

Figure 2:
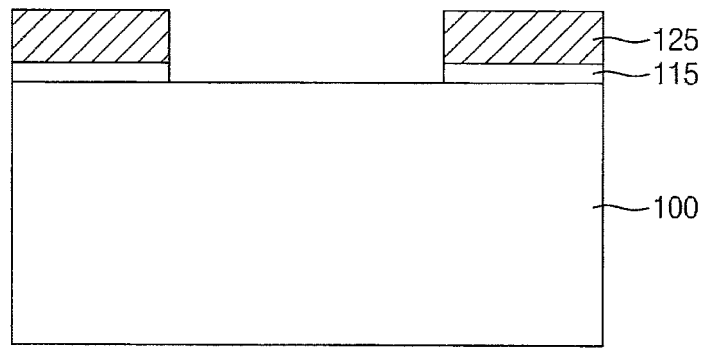

Referring to FIG. 2, the mask layer 120 and the pad oxide layer 110 may be partially removed by, e.g., a photolithography process, to form a mask pattern 125 and a pad oxide pattern 115.

Figure 3:
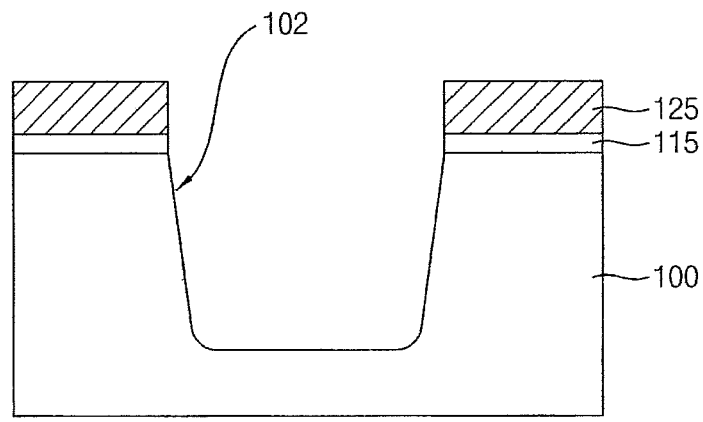

Referring to FIG. 3, an upper portion of the substrate 100 may be etched using the mask pattern 125 and the pad oxide pattern 115 as an etching mask to form a trench 102.

Figure 4:
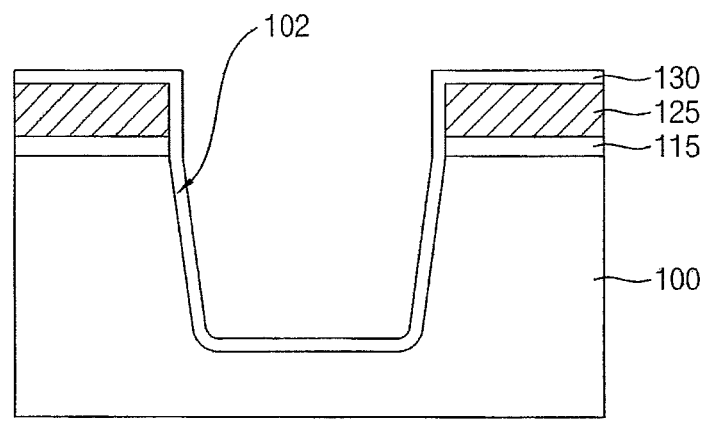

Referring to FIG. 4, an oxide liner 130 may be formed on an inner wall of the trench 102.

In exemplary embodiments, the oxide liner 130 may be formed of silicon oxide by a deposition process, e.g., a CVD process, a PVD process, an ALD process or a sputtering process. In this case, the oxide liner 130, as illustrated in FIG. 4, may be formed conformally along the inner wall of the trench 102, and exposed surfaces of the pad oxide pattern 115 and the mask pattern 125.

In some embodiments, the oxide liner 130 may be formed by thermally oxidizing the inner wall of the trench 102. In this case, the oxide liner 130 may be selectively formed only on the inner wall of the trench 102.

Figure 5:
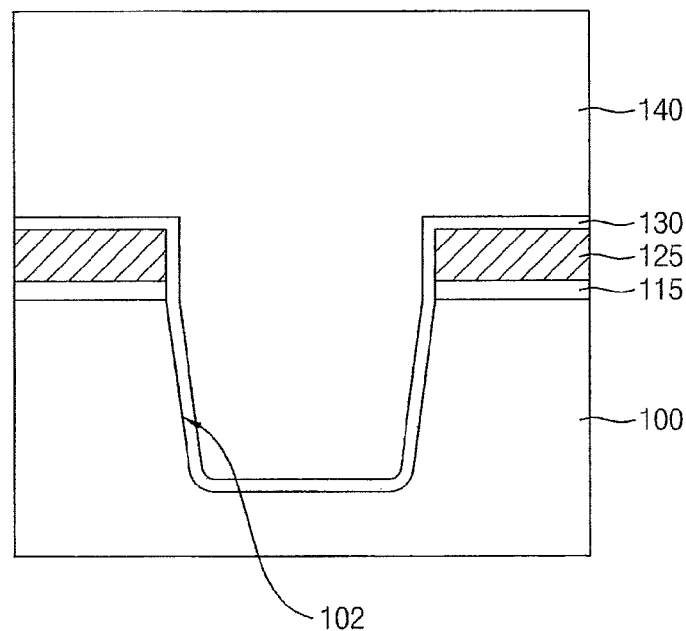

Referring to FIG. 5, a preliminary filling insulation layer 140 may be formed on the oxide liner 130 as seen in FIG. 4.

In exemplary embodiments, the preliminary filling insulation layer 140 may be formed of a siloxane-based material.

For example, the siloxane-based material may include a siloxane oligomer in which an alkyl group, hydrogen or an aromatic group such as a phenyl group may be linked to a silicon (Si) atom. The siloxane oligomer may serve as a polysiloxane precursor.

In an embodiment, the siloxane oligomer may include a dimethylsiloxane oligomer represented by the following Chemical Formula 1.

[Chemical Formula 1]

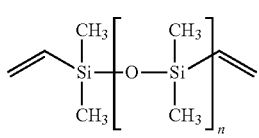

In the Chemical Formula 1 above, n may be an integer in a range from 1 to about 60.

As represented by Chemical Formula 1, the siloxane oligomer may repeatedly include a silicon-oxygen (Si—O) bond, while not including any silicon-nitrogen (Si—N) bonds.

In exemplary embodiments, the siloxane oligomer may be dissolved in a solvent to prepare a siloxane composition, and the siloxane composition may be coated on the oxide liner 130 by, e.g., a spin coating process to form the preliminary filling insulation layer 140.

An organic solvent having relatively good solubility properties with respect to an organic material and relatively good coatability properties may be used as the solvent. For example, the solvent may include a normal alkane material such as n-heptane, xylene, toluene, cyclohexanone, cyclopentanone, tetrahydrofuran (THF), or the like. These solvents may be used alone or in a combination thereof.

In some embodiments, the siloxane composition may further include a cross-linking agent. The cross-linking agent may have a monomer structure containing a siloxane unit. For example, the cross-linking agent may include a compound represented by the following Chemical Formula 2.

[Chemical Formula 2]

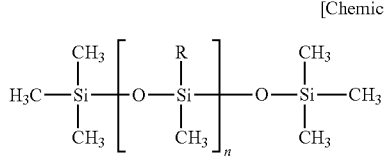

In the Chemical Formula 2 above, n may be an integer, e.g., in a range from 1 to about 10. R may be hydrogen (H) or methyl (CH$_3$).

In some embodiments, the siloxane composition may further include a catalyst for facilitating a subsequent curing process. For example, the catalyst may include a transition metal-based catalyst such as platinum (Pt), nickel (Ni), rhodium (Rh), etc.

In some embodiments, the preliminary filling insulation layer 140 may include a prepolymer formed from a partial polymerization of the siloxane oligomer.

Figure 6:
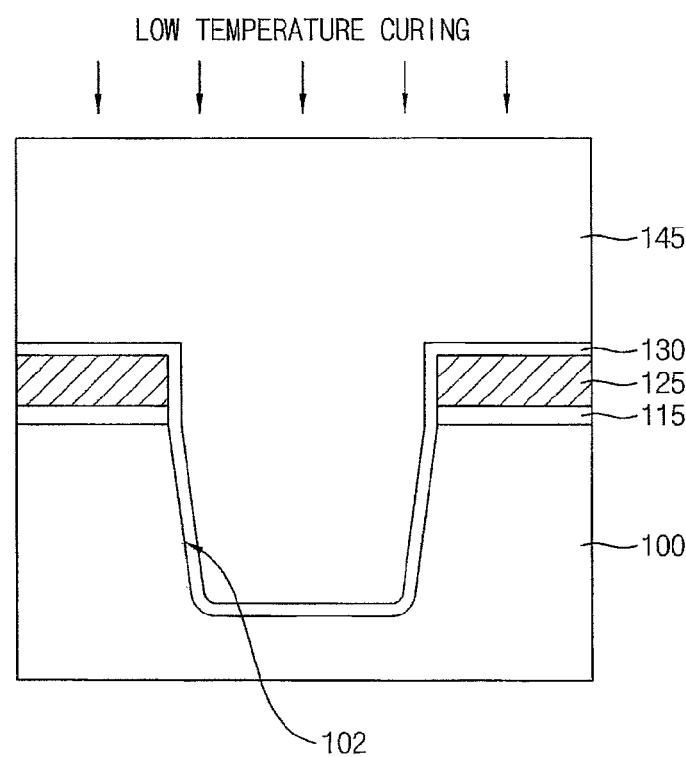

Referring to FIG. 6, the preliminary filling insulation layer 140 may be cured to be transformed into a cured filling insulation layer 145.

In exemplary embodiments, the curing process may include a low temperature curing process performed at a temperature less than about 150° C. In some embodiments, the low temperature curing process may be performed at a temperature in a range from about 50° C. to about 150° C. In some embodiments, the low temperature curing process may be performed at a temperature in a range from about 50° C. to about 100° C.

The siloxane oligomer and/or the siloxane prepolymer included in the preliminary filling insulation layer 140 may be polymerized together with the cross-linking agent by the curing process to form the cured filling insulation layer 145 including polysiloxane.

For example, the cured filling insulation layer 145 including polysiloxane may be formed at a temperature of about 80° C. using a Pt catalyst through a mechanism illustrated by the following chemical Reaction Equation by the curing process (or the low temperature curing process).

[Reaction Equation]

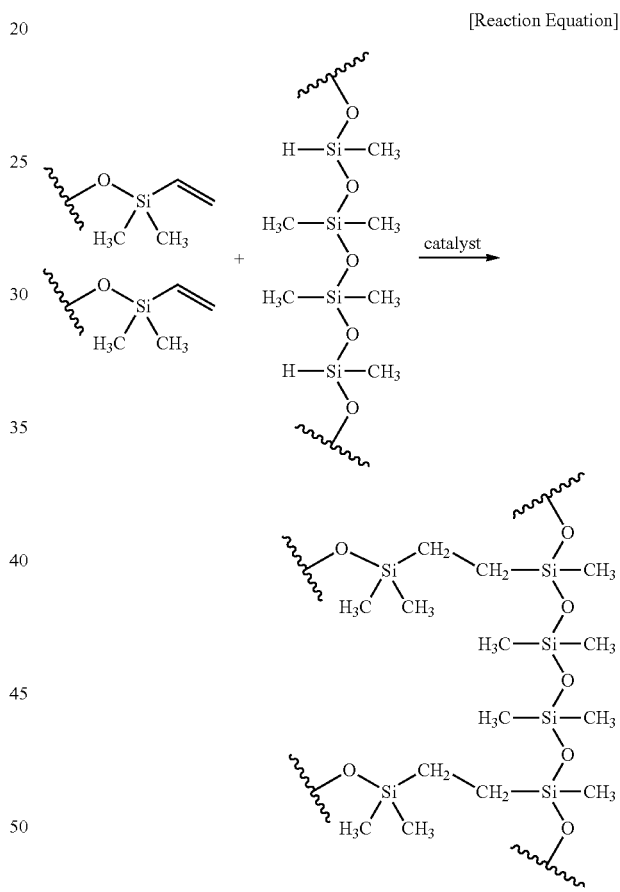

In some embodiments, the cured filling insulation layer 145 may include polymethylsiloxane, polydimethylsiloxane (PDMS), polymethylphenylsiloxane, or the like, depending on the starting siloxane-based material. In an embodiment, the cured filling insulation layer 145 may include PDMS.

As described above, the cured filling insulation layer 145 including PDMS may be obtained using a low temperature curing process. In this way, the substrate 100 may be protected from possible damage that could result from a high temperature thermal treatment (i.e., exposure to thermal conditions in excess of about 150° C.), and the cured filling insulation layer 145 may be easily formed using, e.g., a hot plate, without requiring an additional annealing apparatus.

Figure 7:
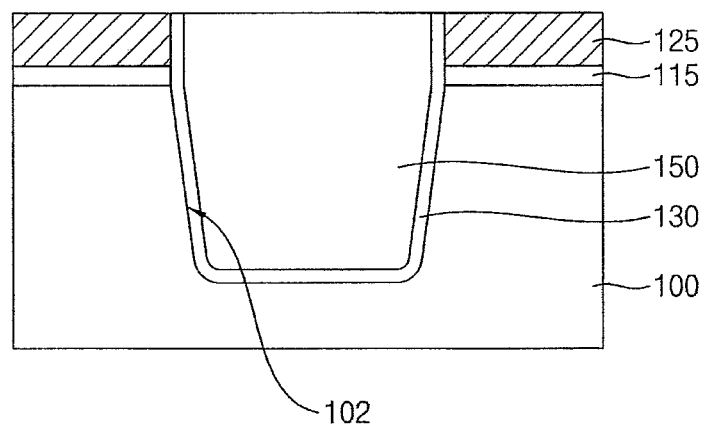

Referring to FIG. 7, an upper portion of the cured filling insulation layer 145 may be planarized to form an isolation layer 150.

In exemplary embodiments, the planarization process may include a chemical mechanical polish (CMP) process. A top surface of the mask pattern 125 may substantially function as a polish stopper. Accordingly, the cured filling insulation layer 145 may be planarized until the top surface of the mask pattern 125 may be exposed to form the isolation layer 150. A portion of the oxide liner 130 formed on the top surface of the mask pattern 125 may also be planarized by the CMP process.

In some embodiments, a cleaning process may then be further performed on the top surface of the mask pattern 125 as seen in FIG. 7 so that oxide residues may be removed.

Figure 8:
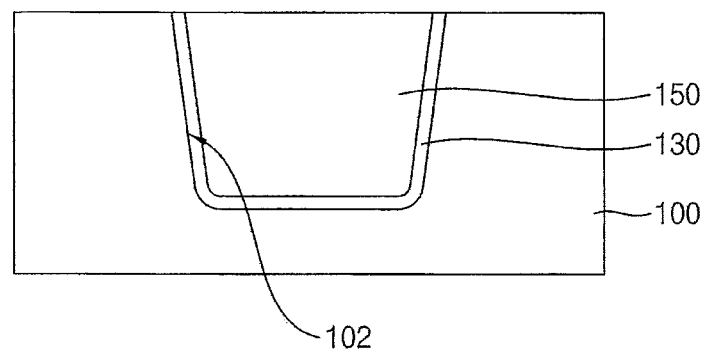

Referring to FIG. 8, the mask pattern 125 and the pad oxide pattern 115 may be removed.

In some embodiments, an etch-back process or an additional CMP process may be performed to remove an upper portion of the isolation layer 150. For example, in a first step, upper portions of the isolation layer 150 and the oxide liner 130 may be removed until a top surface of the isolation layer 150 becomes coplanar with a top surface of the pad oxide pattern 115. Subsequently, in a second step, the mask pattern 125 may be removed by a wet etching process using an etchant solution such as phosphoric acid.

In a third step, the pad oxide pattern 115 and upper portions of the oxide liner 130 and the isolation layer 150 may be further planarized until a top surface of the substrate 100 may be exposed, as shown in FIG. 8.

After performing, or as a result of, the processes as described above, an STI structure filling the trench 102 and including the oxide liner 130 and the isolation layer 150 may be formed. In some embodiments, the STI structure may consist essentially of the oxide liner 130 and the isolation layer 150, as shown in FIG. 8.

In some embodiments, a cleaning process may then be further performed on the top surface of the substrate 100 to remove, e.g., oxide residues thereon.

According to exemplary embodiments as described above, the isolation layer 150 may be formed of a polysiloxane-based material, e.g., PDMS. The polysiloxane-based material may be formed by curing the siloxane oligomer at a relatively low temperature, e.g., in a range from about 50° C. to about 150° C. Thus, the substrate 100 may be protected from damage that could be caused by a relatively high temperature annealing process (e.g., at a temperature above about 150° C.), and overall process steps may become simplified as compared with process steps that include a relatively high temperature annealing step.

The siloxane oligomer may include a number of the Si—O bonds, and thus may have enhanced adhesion and/or affinity with respect to the oxide liner 130. Thus, the siloxane oligomer may be coated directly on the oxide liner 130 to form the cured filling insulation layer 145 (FIGS. 5 and 6) and the isolation layer 150 (FIGS. 7 and 8) without forming additional layers such as a wetting layer, a buffer layer, etc., and/or without applying additional compositions.

In exemplary embodiments, the cured filling insulation layer 145 that includes polysiloxane may be directly utilized as the isolation layer 150 after performing the CMP process (FIGS. 7 and 8).

In a comparative illustration of a comparable fabrication process that can be used in this art, polysilazane may be used as the material comprising the isolation layer filling the trench 102 while performing the STI process. Polysilazane, however, may include a number of Si—N bonds. An oxidation process by a wet annealing in a water vapor ($H_2O$) atmosphere may be performed after forming a filling layer that includes polysilazane, so that the filling layer may be transformed into an oxide layer by replacing nitrogen atoms with oxygen atoms.

In this comparative illustration process, however, a nitride liner that includes silicon nitride is further formed on the oxide liner in the trench to prevent the substrate 100 from being oxidized by oxygen active species generated during the oxidation process. However, when a transistor formed on an active region of the substrate 100 is operated, charges may be concentrated or trapped in the nitride liner and they can result in, e.g., a channel length fluctuation of the transistor and reduced operational reliability of the transistor.

In contrast with the comparative illustration process described above, according to exemplary embodiments as described herein, the cured filling insulation layer 145 that includes polysiloxane may already contain a number of Si—O bonds in the molecular structure thereof, and thus may be directly utilized as the isolation layer 150 without performing the wet annealing described in the comparative illustration. Thus, the nitride liner is not needed and may be entirely omitted, and operation failures caused by the nitride liner may be avoided.

Figure 9:
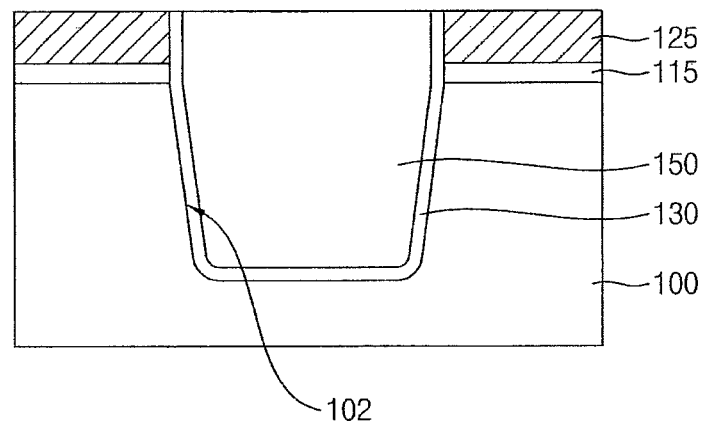
Figure 10:
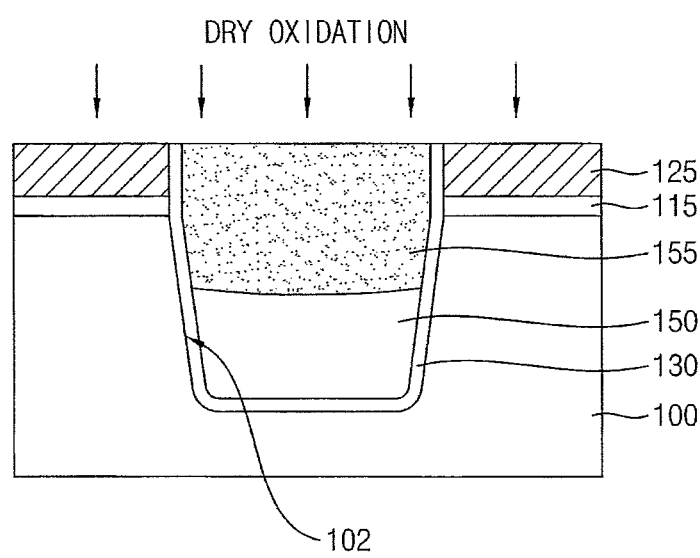
Figure 11:
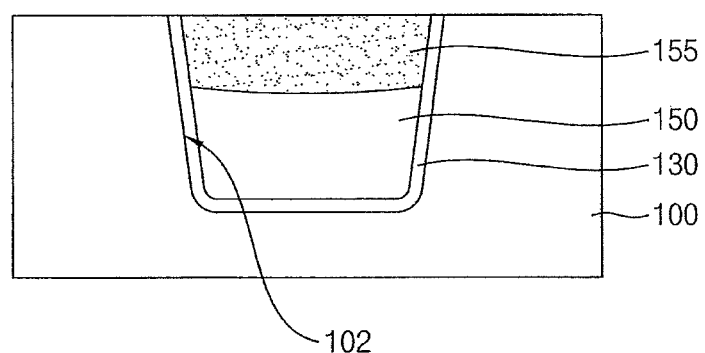

FIGS. 9 to 11 are cross-sectional views illustrating a method of manufacturing a semiconductor device in accordance with some exemplary embodiments. Detailed descriptions of processes and/or materials that are substantially the same as or similar to those described and illustrated with reference to FIGS. 1 to 8 are omitted herein.

Referring to FIG. 9, processes substantially the same as or similar to those illustrated with reference to FIGS. 1 to 7 may be performed.

In exemplary embodiments, a mask pattern 125 and a pad oxide pattern 115 may be formed, a trench 102 may be formed at an upper portion of a substrate 100, and then an oxide liner 130 may be formed on an inner wall of the trench 102. A filling insulation layer including polysiloxane may be formed on the oxide liner 130 to sufficiently fill the trench 102, and the filling insulation layer may be planarized to form an isolation layer 150 as shown in FIG. 9.

Referring to FIG. 10, at least a portion of the isolation layer 150, e.g., an upper portion of the isolation layer 150, may be transformed into a modified isolation layer 155 by a dry oxidation process. In an embodiment (not shown), the isolation layer 150 may be entirely transformed into the modified isolation layer 155.

In exemplary embodiments, the dry oxidation process may include a plasma treatment or an ultraviolet (UV) treatment. For example, at least some of the silicon-carbon (Si—C) bonds included in polysiloxane may be converted to Si—O bonds by the dry oxidation process. Thus, the modified isolation layer 155 may have a degree of oxidation (i.e., a number of the Si—O bonds relative to the number of total Si atoms in the polysiloxane) that is greater than that of the isolation layer 150. The modified isolation layer 155 may have a substantially silicate structure.

As described above, Si—O bonds may be additionally generated in the modified isolation layer 155 from the polysiloxane by the plasma treatment or the UV treatment, and thus the wet annealing step used in connection with the comparative illustration process described above may be omitted. Therefore, a nitride liner in the trench 102 is not needed and may be omitted, so that an operational reliability of a circuit device, e.g., a transistor, fabricated in accordance with the inventive concepts may be improved.

Referring to FIG. 11, a process substantially the same as or similar to that described and illustrated with reference to FIG. 8 may be performed on the structure as illustrated in FIG. 10.

In exemplary embodiments, upper portions of the modified isolation layer 155 and the oxide liner 130 may be partially removed, and the mask pattern 125 may be entirely removed. Subsequently, the pad oxide pattern 115, and upper portions of the oxide liner 130 and the modified isolation layer 155 may be additionally planarized or polished until a top surface of the substrate 100 may be exposed as shown in FIG. 11.

FIGS. 12 to 16, FIGS. 17A and 17B, and FIGS. 18A and 18B are cross-sectional views illustrating a method of manufacturing a semiconductor device in accordance with exemplary embodiments.

Detailed descriptions of processes and/or materials that are substantially the same as or similar to those described and illustrated with reference to FIGS. 1 to 8 and FIGS. 9 to 11 are omitted herein.

Figure 12:
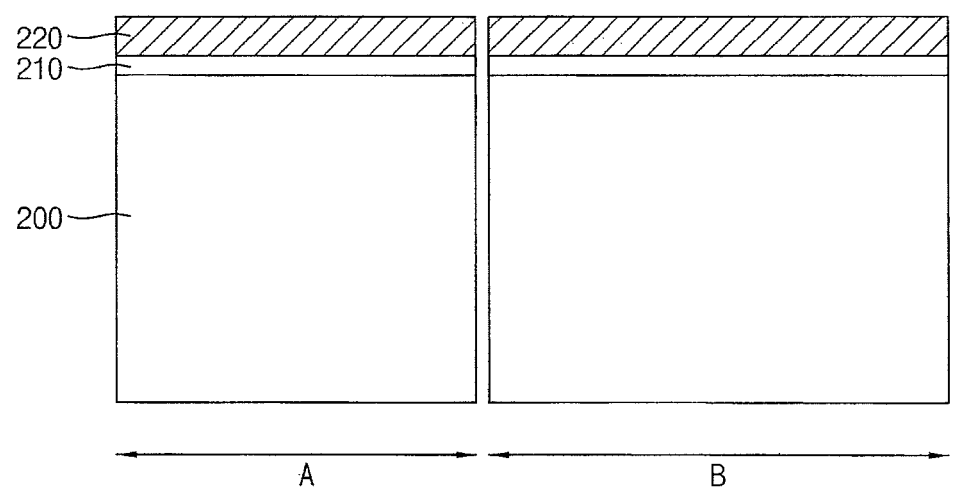

Referring to FIG. 12, a process substantially the same as or similar to that described previously with reference to FIG. 1 may be performed. Accordingly, a pad oxide layer 210 and a mask layer 220 may be sequentially formed on a substrate 200.

The substrate 200 may be divided into a first region A and a second region B. In some embodiments, the first region A of the substrate 200 may be allotted as a device region at which a memory device and/or a logic device may subsequently be formed. The second region B of the substrate 200 may be allotted as a peripheral circuit region.

The oxide layer 210 and the mask layer 220 may be formed of silicon oxide and silicon nitride, respectively.

Figure 13:
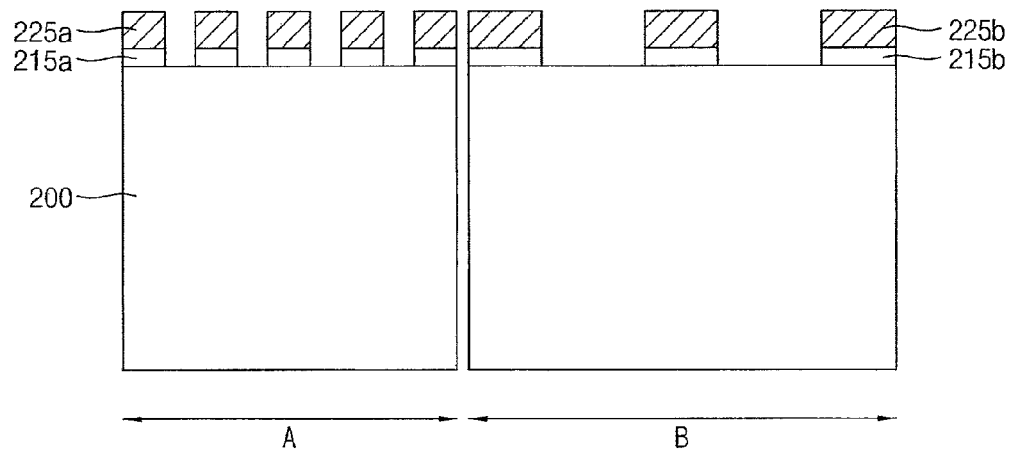

Referring to FIG. 13, as also described and illustrated with reference to FIG. 2, the mask layer 220 and the pad oxide layer 210 may be partially etched. Accordingly, a first pad oxide pattern 215a and a first mask pattern 225a may be formed on the first region A of the substrate 200, and a second pad oxide pattern 215b and a second mask pattern 225b may be formed on the second region B of the substrate 200.

In exemplary embodiments, a distance between the first mask patterns 225a on the first region A (i.e., the device region) may be smaller than a distance between the second mask patterns 225b on the second region B (i.e., the peripheral circuit region).

Figure 14:
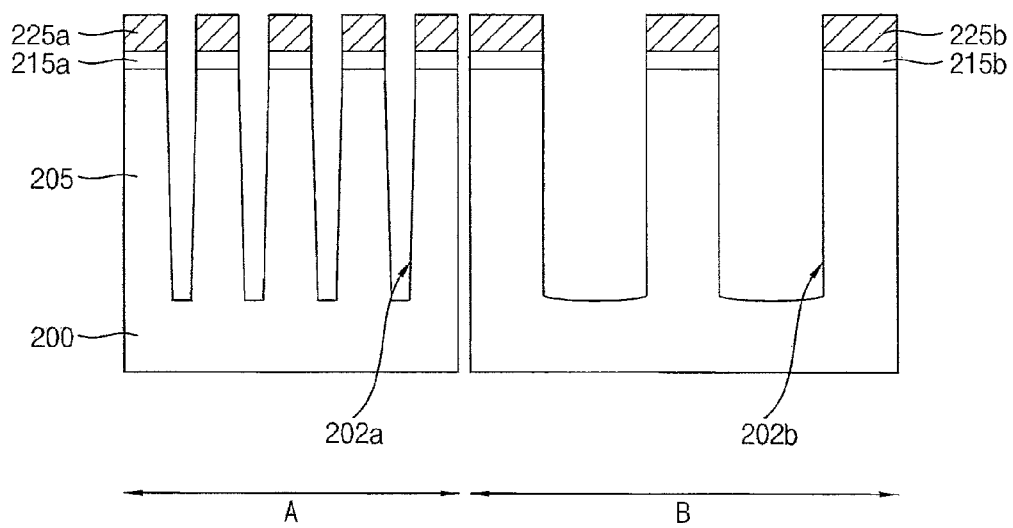

Referring to FIG. 14, an upper portion of the substrate 200 may be etched using the mask patterns 225a and 225b. Accordingly, a plurality of first trenches 202a may be formed in the first region A of the substrate 200, and a plurality of second trenches 202b may be formed in the second region B of the substrate 200.

In exemplary embodiments, the second trenches 202b may be wider than the first trenches 202a.

Figure 15:
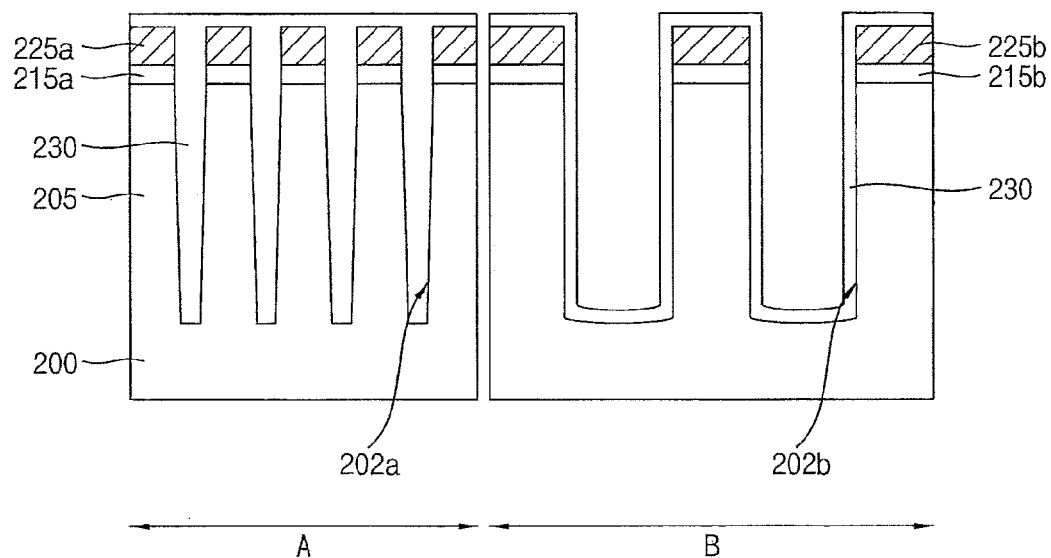

Referring to FIG. 15, a process substantially the same as or similar to that described and illustrated with reference to FIG. 4 may be performed on the structure as illustrated in FIG. 14 to form an oxide liner 230.

The oxide liner 230 may extend along inner walls of the trenches 202a and 202b, and also along the surfaces of the mask patterns 225a and 225b and the pad oxide patterns 215a and 215b.

In exemplary embodiments, as also illustrated in FIG. 15, the trenches 202a may be substantially fully filled with the oxide liner at the first region A. For example, the oxide liner 230 may sufficiently fill the first trenches 202a, and may cover the first pad oxide pattern 215a and the first mask pattern 225a.

The oxide liner 230 may extend along a profile of the inner wall of the second trenches 202b at the second region B. For example, the oxide liner 230 may be formed conformally along surfaces of the second mask pattern 225b and the second pad oxide pattern 215b, and the inner walls of the second trenches 202b Referring to FIG. 16, processes substantially the same as or similar to those described and illustrated with reference to FIGS. 7 and 8 may be performed on the structure as shown in FIG. 15.

In exemplary embodiments, a preliminary filling insulation layer sufficiently filling the second trenches 202b may be formed using the above-mentioned siloxane composition on the oxide liner 230. A low temperature curing process may be performed on the preliminary filling insulation layer at a temperature in a range from about 50° C. to about 150° C., in some embodiments, from about 50° C. to about 100° C., to form a cured filling insulation layer 245.

Accordingly, the cured filling insulation layer 245 may include a polysiloxane-based material, e.g., PDMS.

Figure 17A:
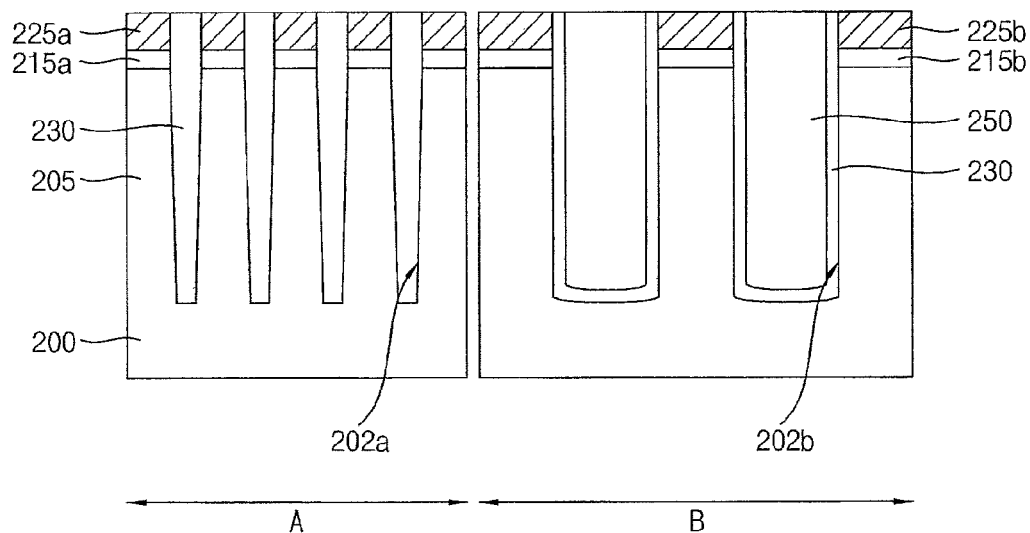
Figure 17B:
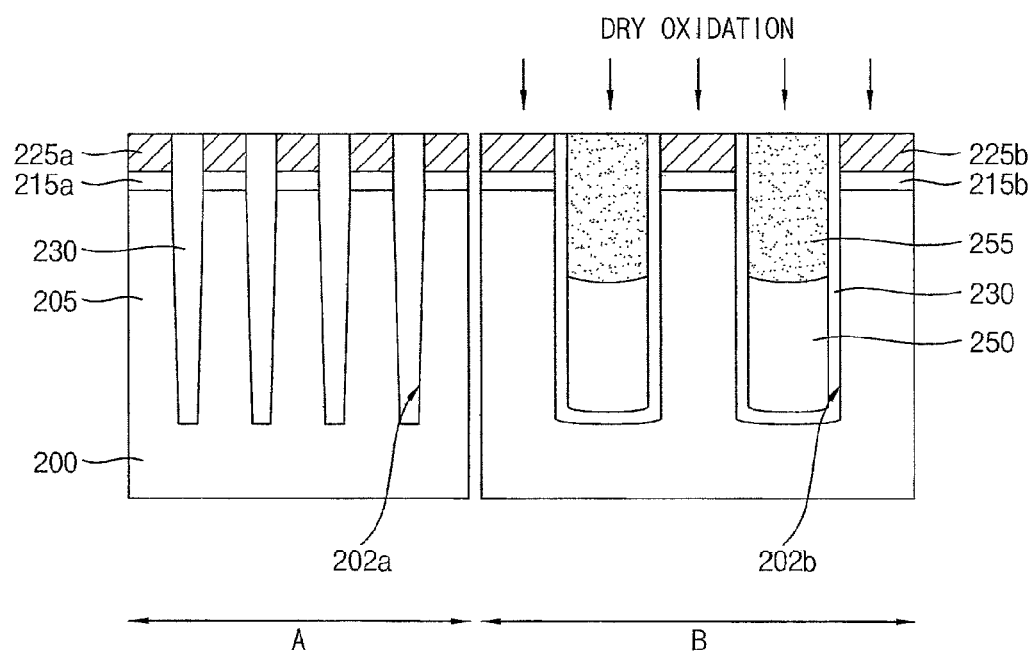

Referring to FIGS. 17A and 17B, as also described and illustrated with reference to FIG. 7, an upper portion of the cured filling insulation layer 245 may be planarized by, e.g., a CMP process, until top surfaces of the first and second mask patterns 225a and 225b may be exposed.

Accordingly, an isolation layer 250 at the second region B may be formed in the second trenches 202b. The oxide liner 230 may remain in the first trenches 202a at the first region A, and may serve as an isolation layer at the first region A.

In some embodiments, as illustrated in FIG. 17A, the cured filling insulation layer 245 including the polysiloxane-based material may be directly serve as the isolation layer 250 after the CMP process.

In some embodiments, as illustrated in FIG. 17B, a dry oxidation process substantially the same as or similar to that described and illustrated with reference to FIG. 10 may be further performed. Accordingly, at least an upper portion of the isolation layer 250 formed in the second region B (as shown in FIG. 17A) may be transformed into a modified isolation layer 255 which may have a substantially silicate structure, and may have an increased number of Si—O bonds.

As described above, the dry oxidation process may include a plasma treatment or a UV treatment, but a wet annealing is not needed in this process and thus may be omitted. Thus, the isolation layer having improved insulation properties may be formed in, e.g., the second trenches 202b without forming a nitride liner.

Figure 18A:
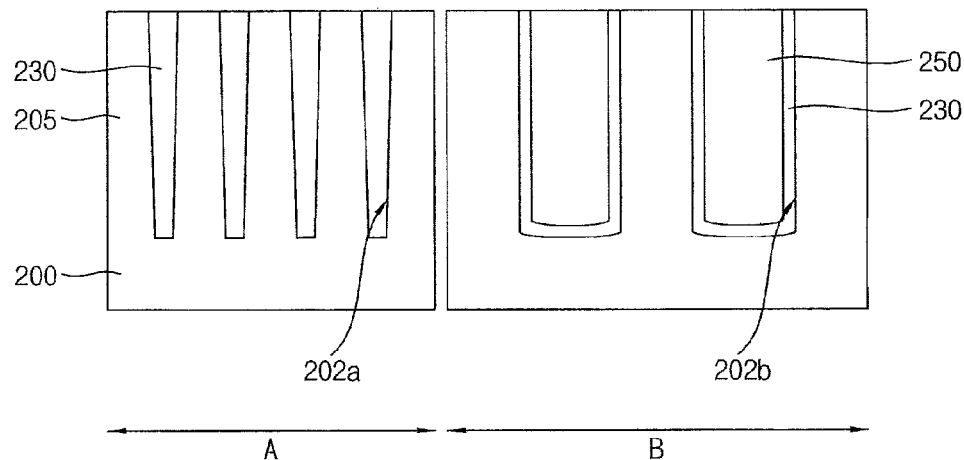
Figure 18B:
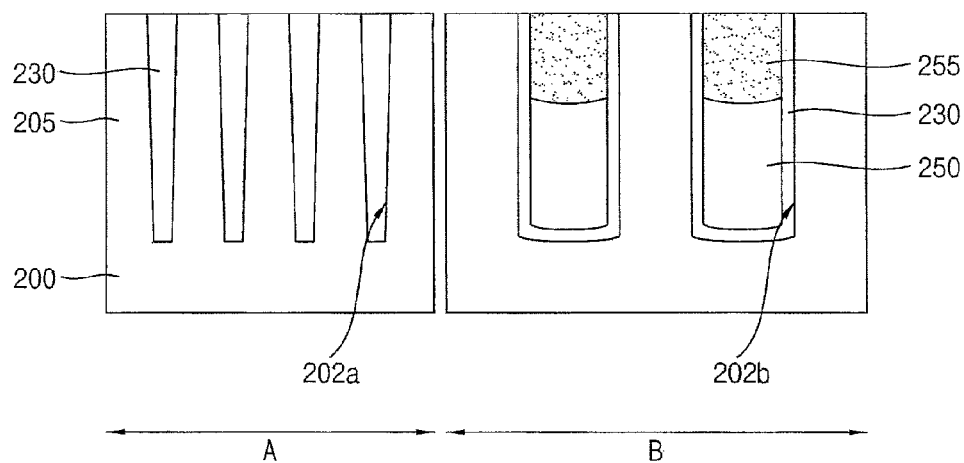

Referring to FIGS. 18A and 18B, a process substantially the same as or similar to that described and illustrated with reference to FIG. 8 may be performed on the structure as shown in FIG. 17B. For example, the mask patterns 225a and 225b may be removed; and, the pad oxide patterns 215a and 215b, the oxide liner 230 and the isolation layer 250 (or the modified isolation layer 255) may be additionally removed or planarized. Accordingly, STI structures defining active regions may be formed in the first region A and the second region B of the substrate 200.

The oxide liner 230 may serve substantially solely as the STI structure in the first region A of the substrate 200. The isolation layer 250 (as this feature is identified in FIG. 18A) and/or the modified isolation layer 255 (see FIG. 17B) may serve as the STI structure together with the oxide liner 230 in the second region B of substrate 200.

According to exemplary embodiments as described above, the isolation layer may be formed from the oxide liner 230 in the first region A (e.g., the device region) where a distance or a pitch of the active regions may be relatively small (compared with the second region B). Accordingly, device defects, such as a void generated when a narrow trench may be filled with the polysiloxane-based material such as PDMS having a low step coverage or a low filling property, may be avoided or at least reduced.

The isolation layer including the polysiloxane-based material may be formed by coating the siloxane composition in the second region B (e.g., the peripheral circuit region) where a distance or a pitch of the active regions may be relatively large (compared with the first region A). Thus, the STI structure having an improved low dielectric (low-k) property may be obtained.

Figure 19:
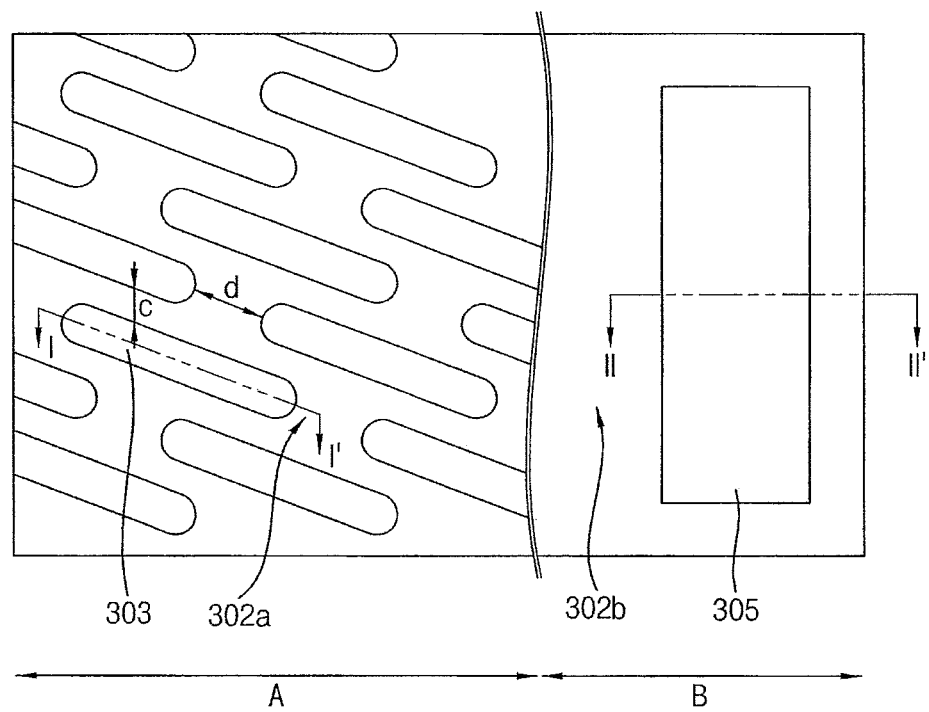

FIGS. 19 to 28 are a top plan view and cross-sectional views illustrating a method of manufacturing a semiconductor device in accordance with exemplary embodiments. Specifically, FIG. 19 is a top plan view illustrating the method. FIGS. 20 to 28 include various cross sectional views taken along the lines I-I' and II-IF indicated in a first region A and a second region B, respectively, of FIG. 19.

For example, FIGS. 19 to 28 illustrate a method of manufacturing a dynamic random access memory (DRAM) device in accordance with exemplary invention embodiments. Detailed descriptions of processes and/or materials that are substantially the same as or similar to those illustrated with reference to FIGS. 1 to 8, FIGS. 9 to 11, or FIGS. 12 to 16, 17A, 17B, 18A and 18B are omitted herein.

Figure 20:
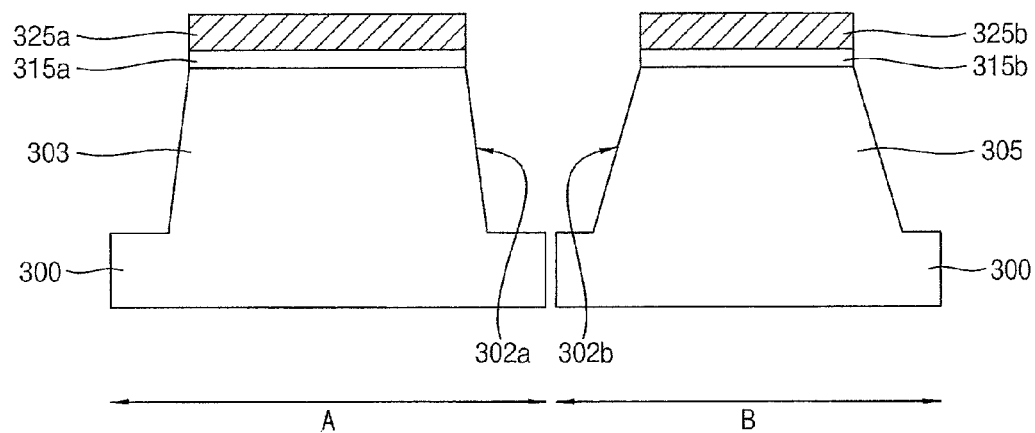

Referring to FIGS. 19 and 20, an upper portion of a substrate 300 may be etched to form isolation trenches 302a (in first region A) and 302b (in second region B) defining active patterns 303 and 305, respectively.

The substrate 300 may be divided into a first region A and a second region B, and the first region A and the second region B may be allotted as a device region and a peripheral circuit region, respectively.

In exemplary embodiments, as also illustrated with reference to FIGS. 12 and 13, a first pad oxide pattern 315a and a first mask pattern 325a may be formed on the substrate 300 in the first region A, and a second pad oxide pattern 315b and a second mask pattern 325b may be formed on the substrate 300 in the second region B. For convenience of descriptions, illustrations of the mask patterns and the pad oxide patterns (as shown in FIG. 20) are not shown in FIG. 19.

The upper portions of the substrate 300 may then be partially removed using the first mask pattern 325a and the second mask pattern 325b as etching masks to form a first isolation trench 302a and a second isolation trench 302b in the first region A and the second region B, respectively. A first active pattern 303 and a second active pattern 305 protruding from a lower portion of the substrate 300 may be defined in the first region A and the second region B, respectively, through the formation of the first and second isolation trenches 302a and 302b, as shown in FIG. 20.

The first active pattern 303 may extend in a diagonal direction that is oriented at a predetermined angle with respect to a first direction and a second direction, the first and second directions being substantially parallel to a top surface of the substrate 300 and perpendicular to each other. A plurality of the diagonally-oriented first active patterns 303 may be arranged along the first and second directions in the first region A, as shown in FIG. 19.

The second active pattern 305 may have, e.g., a plate shape (e.g., a rectangular shape) as illustrated in FIG. 19.

In some embodiments, the second isolation trench 302b may have a second trench width greater than a first trench width of the first isolation trench 302a. In some embodiments, a first trench width of the first isolation trench 302a between the first active patterns 303 as measured along the first direction (indicated as "c" in FIG. 19) may be smaller than a first trench width of the first isolation trench 302a between the first active patterns 303 as measured along the diagonal direction (indicated as "d" in FIG. 19).

Figure 16:
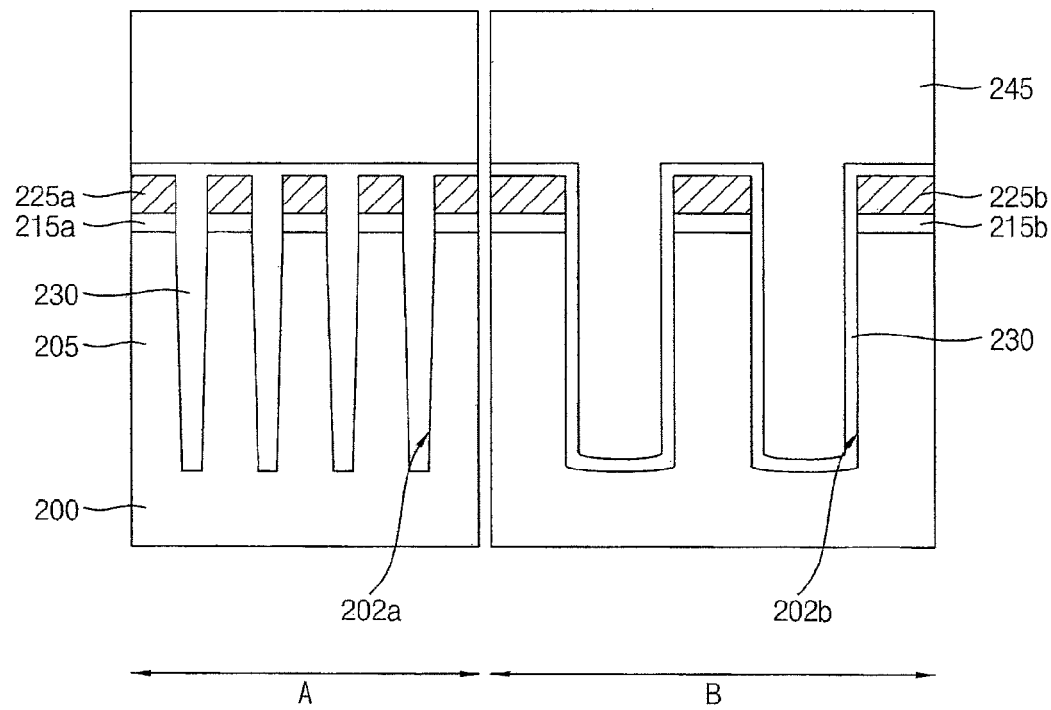
Figure 21:
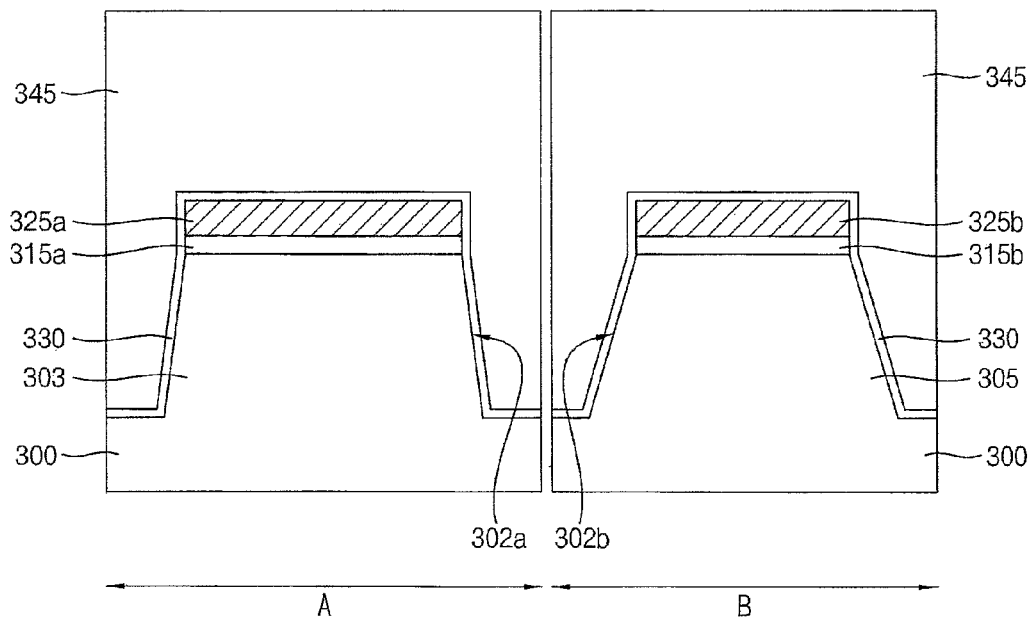

Referring to FIG. 21, e.g., processes substantially the same as or similar to those described and illustrated with reference to FIGS. 15 and 16 may be performed on the structure as shown in FIG. 20.

In exemplary embodiments, an oxide liner 330 may be formed along inner walls of the first and second isolation trenches 302a and 302b, and also along surfaces of the mask patterns 325a and 325b and the pad oxide patterns 315a and 315b. A cured filling insulation layer 345 sufficiently filling the first and second isolation trenches 302a and 302b may then be formed on the oxide liner 330.

In some embodiments, a portion of the first isolation trench 302a between the first active patterns 303 as measured along the first direction (indicated as "c" in FIG. 19) may have a relatively narrow first trench width as described above, and may be substantially fully filled with the oxide liner 330.

As described above, a preliminary filling insulation layer may first be formed using a siloxane composition by a spin coating process, and then a low temperature curing process may be performed thereon to form the cured filling insulation layer 345 including a polysiloxane-based polymer such as PDMS.

Figure 22:
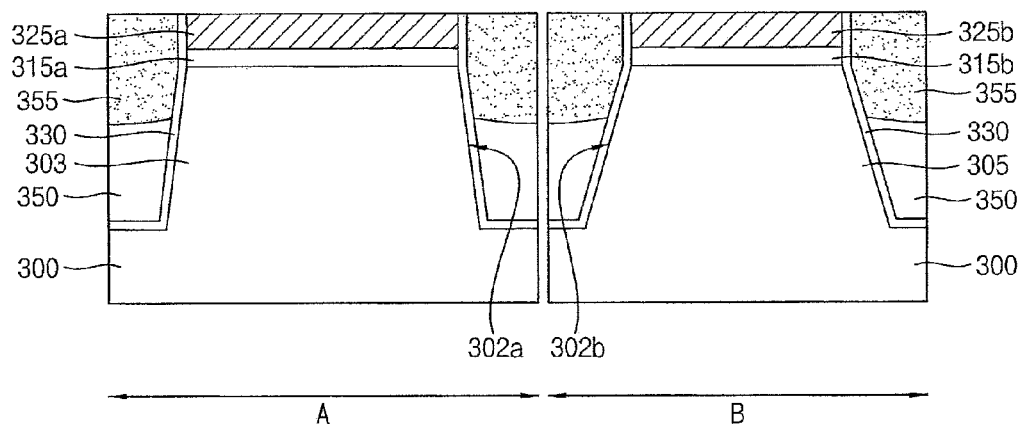

Referring to FIG. 22, an upper portion of the cured filling insulation layer 345 as shown in FIG. 21 may be planarized by a CMP process until top surfaces of the mask patterns 325a and 325b may be exposed to form an isolation layer 350 comprising planarized portions of the cured filling insulation layer 345. An upper portion of the oxide liner 330 may be also planarized together with the cured filling insulation layer 345.

In some exemplary embodiments, e.g., as described and illustrated with reference to FIG. 10 or FIG. 17B, a dry oxidation process may be further performed on the cured filling insulation layer 345. Accordingly, at least an upper portion of the isolation layer 350 may be transformed into a modified isolation layer 355 having a silicate structure as shown in FIG. 22.

Figure 23:
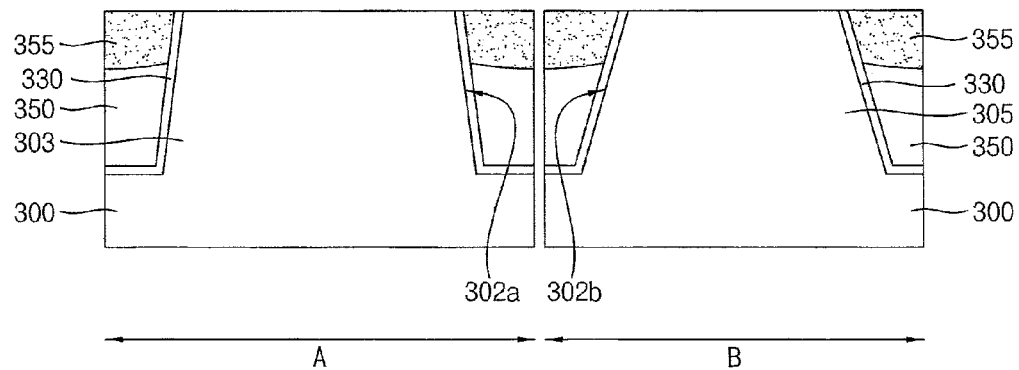

Referring to FIG. 23, as also described and illustrated with reference to FIG. 8 or FIGS. 18A and 18B, the mask patterns 325a and 325b may then be removed. The pad oxide patterns 315a and 315b, and upper portions of the oxide liner 330 and the modified isolation layer 355 (or the isolation layer 350 if the dry oxidation process has not been performed) may be additionally planarized until top surfaces of the active patterns 303 and 305 may be exposed.

Accordingly, STI structures defining the active patterns 303 and 305 may be formed in the first region A and in the second region B, respectively, of the substrate 300.

In some embodiments, the STI structure consisting of the oxide liner 330 may be formed in the portion of the first isolation trench 302a along the first direction as indicated by "c" in FIG. 19. The STI structure substantially consisting of the oxide liner 330 and the isolation layer 350 (including the modified isolation layer 355) may be formed in a portion of the first isolation trench 302a along the diagonal direction as indicated by "d" in FIG. 19 and also in the second isolation trench 302b.

Figure 24:
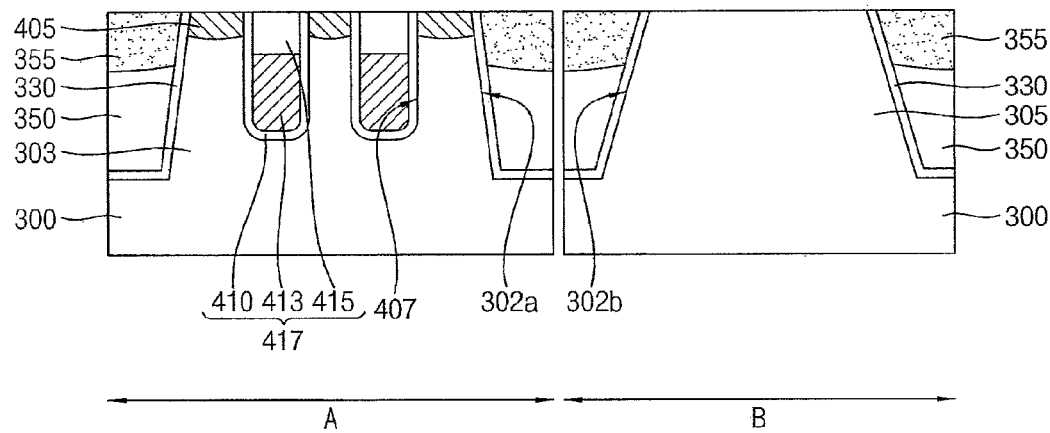

Referring to FIG. 24, a transistor including a first gate structure 417 and a first impurity region 405 may be formed in the first region A of the structure as shown in FIG. 23.

In exemplary embodiments, a gate trench 407 extending through an upper portion of the first active pattern 303 may be formed. For example, the gate trench 407 may extend in the first direction as indicated by "c" in FIG. 19, and may extend through upper portions of the first active patterns 303, the isolation layer 350 and the oxide liner 330. A plurality of the gate trenches 407 may be formed along the second direction (i.e., a direction that is orthogonal to the first direction) in the first region A. In some embodiments, as illustrated in FIG. 24, two gate trenches 407 as described above may be formed at each first active pattern 303.

For example, a thermal oxidation process may be performed on surfaces of the first active patterns 303 exposed by the gate trench 407 to form a first gate insulation layer. Alternatively, silicon oxide or a metal oxide may be deposited by, e.g., a CVD process, on the surfaces of the first active patterns 303 to form the gate insulation layer.

A first gate conductive layer filling the gate trenches 407 may be formed on the first gate insulation layer. The first gate conductive layer and the first gate insulation layer may be planarized by a CMP process until the top surface of the first active pattern 303 may be exposed, and an upper portion of the first gate conductive layer formed in the gate trench 407 may be partially removed by an etch-back process. Accordingly, the first gate insulation pattern 410 may be formed in an inner wall of the gate trench 407, and a first gate electrode 413 filling a lower portion of the gate trench 407 may be formed on the first gate insulation pattern 410.

The first gate conductive layer may be formed of, e.g., a metal and/or a metal nitride by an ALD process or a sputtering process.

A first gate mask layer filling a remaining portion of the gate trench 407 may be formed on the first gate insulation pattern 410 and the first gate electrode 413. An upper portion of the first gate mask layer may be planarized until the top surface of the first gate active pattern 303 may be exposed to form a first gate mask 415 as shown in FIG. 24. The first gate mask layer may be formed of, e.g., silicon nitride, by a CVD process.

Accordingly, the first gate structure 417 that includes the first gate insulation pattern 410, the first gate electrode 413 and the first gate mask 415 sequentially stacked in the gate trench 407 may be formed.

According to the arrangement of the gate trenches 407 as described above, the first gate structure 417 may extend in the first direction, and a plurality of the gate structures 417 may be formed along the second direction as these two directions have previously been described.

An ion-implantation process may then be performed to form a first impurity region 405 at an upper portion of the first active pattern 303 adjacent to the first gate structure 417. Accordingly, e.g., a buried cell array transistor (BCAT) structure including the first gate structure 417 and the first impurity region 405 may be formed in the first region A of the substrate 300.

Figure 25:
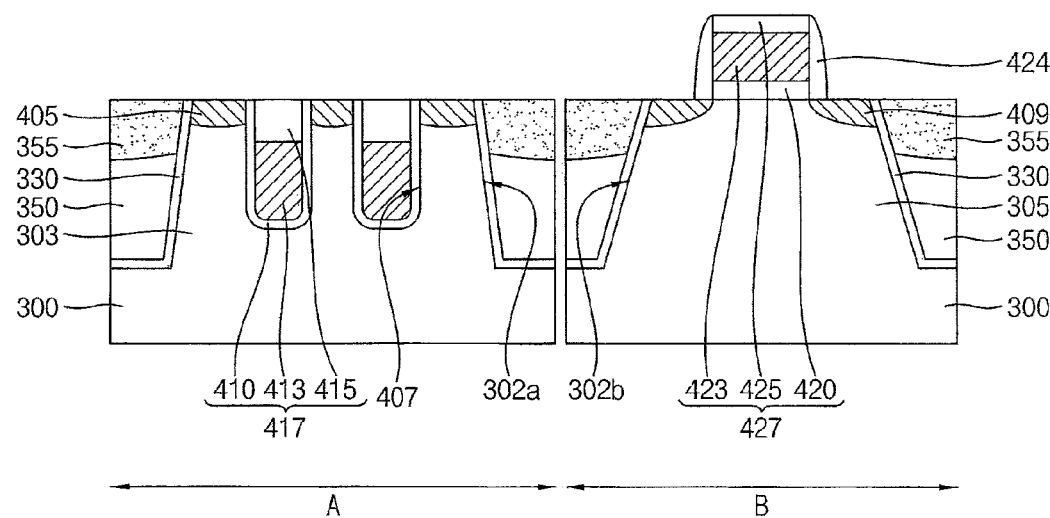

Referring to FIG. 25, a second gate structure 427 may be formed on the second active pattern 305 of the structure as shown in FIG. 24.

In exemplary embodiments, a second gate insulation layer, a second gate conductive layer and a second gate mask layer may be sequentially formed in the second region B of the substrate 300, and may be patterned by a photo-lithography process to form the second gate structure 427 including a second gate insulation pattern 420, a second gate electrode 423 and a second gate mask 425 sequentially stacked on the second active pattern 305.

Impurities may be implanted at an upper portion of the second active pattern 305 using the second gate structure 427 as an ion-implantation mask to form a second impurity region 409. Accordingly, a peripheral circuit transistor including the second gate structure 427 and the second impurity region 409 may be formed in the second region B of the substrate 300.

A gate spacer 424 may be further formed on a sidewall of the second gate structure 427. For example, a spacer layer including silicon nitride and covering the second gate structure 427 may be formed, and that structure may then be anisotropically etched to remove the upper layer of silicon nitride and to form the gate spacer 424 as shown in FIG. 25.

Figure 26:
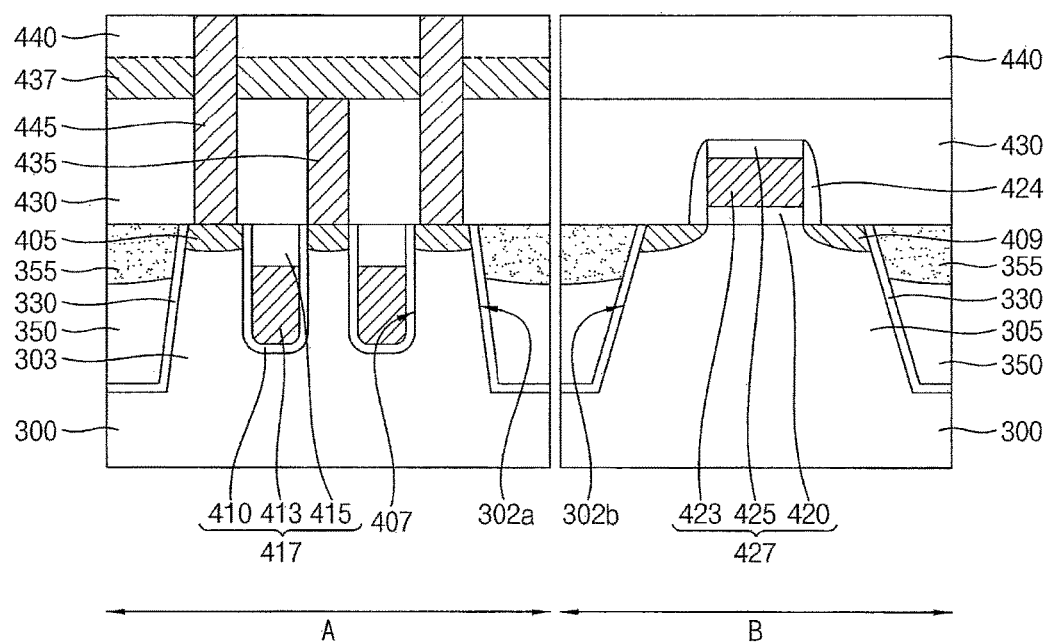

Referring to FIG. 26, a first insulating interlayer 430 covering the first and second gate structures 417 and 427 (as shown in FIG. 25) may be formed on the first and second active patterns 303 and 305, respectively, the isolation layer 350 and the oxide liner 330. The first insulating interlayer 430 may be formed of a silicon oxide-based material such as plasma enhanced oxide (PEOX), tetraethyl orthosilicate (TEOS), flowable oxide (FOX), or the like by a CVD process or a spin coating process.

A first contact 435 (or a plurality of first contacts 435) electrically connected to the first impurity region 405 may be formed through the first insulating interlayer 430. For example, the first contact 435 may be electrically connected to a central portion of the first impurity region 405 formed between the first gate structures 417. A conductive line 437 (or a plurality of conductive lines 437) electrically connected to the first contact 435 may be formed on the first insulating interlayer 430.

The conductive line 437 may extend in the second direction (as described with reference to FIG. 19) in the first region A, and may be electrically connected to a plurality of the first contacts 435. A plurality of the conductive lines 437 may be formed along the first direction (as described above with reference to FIG. 19). In some embodiments, the first contact 435 and the conductive line 437 may be integral with each other, and may be provided as a single or unitary member.

In some embodiments, the first contact 435 and the conductive line 437 may serve as a bit line contact and a bit line, respectively.

A second insulating interlayer 440 covering the conductive line 437 may be formed on the first insulating interlayer 430. A second contact 445 electrically connected to the first impurity region 405 may be formed through the second and first insulating interlayers 440 and 430. The second contact 445 may be electrically connected to a portion of the first impurity region 405 formed at a peripheral portion of the first active pattern 303. In some embodiments, the second contact 445 may serve as a capacitor contact.

The second insulating interlayer 440 may be formed of a silicon oxide-based material substantially the same as or similar to that of the first insulating interlayer 430. The first contact 435, the second contact 445 and the conductive line 437 may be formed of a metal, a metal nitride, a metal silicide or a doped polysilicon.

Figure 27:
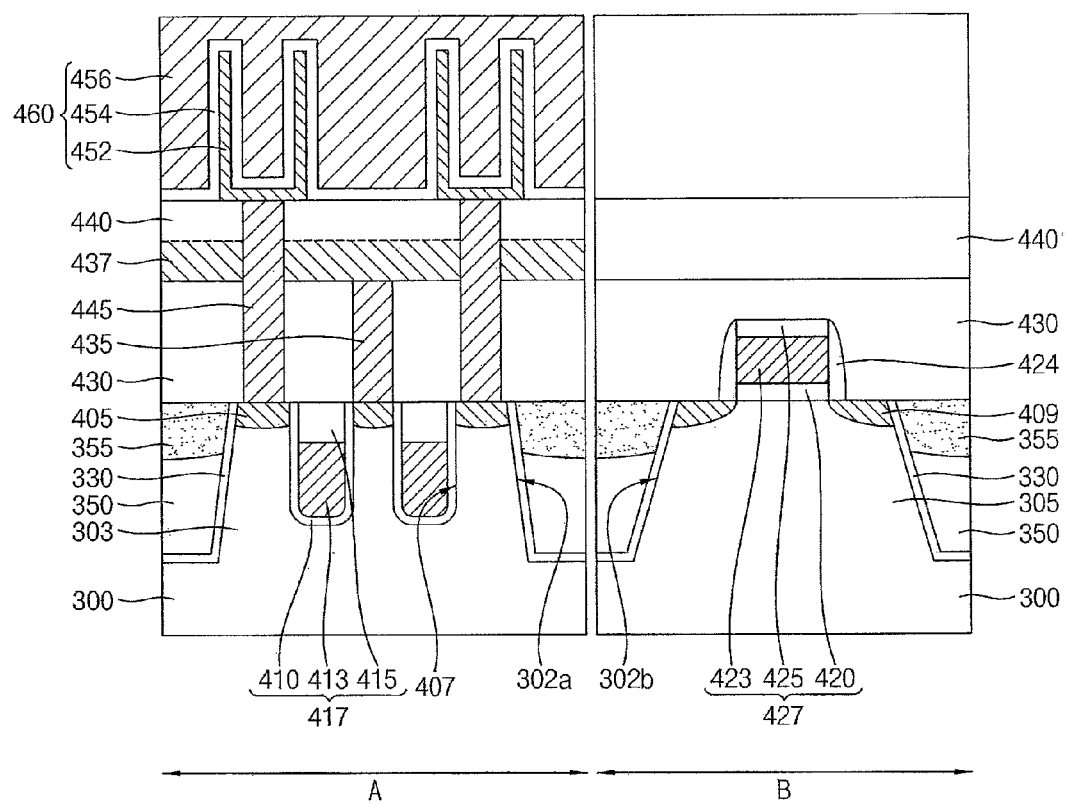

Referring to FIG. 27, a capacitor 460 may be formed on the second contact 445 as shown in FIG. 26.

For example, an etch-stop layer (not illustrated) may be formed on the second insulating interlayer 440 and the second contact 445 in the first region A, and a mold layer (not illustrated) may be formed on the etch-stop layer. The mold layer and the etch-stop layer may be partially removed to form an opening through which a top surface of the second contact 445 may be exposed.

A lower electrode layer may then be formed along an inner wall of the opening and a top surface of the mold layer. A sacrificial layer (not illustrated) may be formed on the lower electrode layer, and upper portions of the sacrificial layer and the lower electrode layer may be planarized such that the top surface of the mold layer may be exposed. The sacrificial layer and the mold layer may then be removed to form a lower electrode 452. The sacrificial layer and the mold layer may be formed of silicon oxide, and may be removed using an etchant solution that may include fluoric acid.

A dielectric layer 454 may be formed on surfaces of the etch-stop layer and the lower electrode 452, and an upper electrode layer may be formed on the dielectric layer 454. Portions of the dielectric layer 454 and the upper electrode layer that are formed in the second region B may be removed to leave an upper electrode 456 formed in the first region A as shown in FIG. 27.

The lower and upper electrode layers may be formed of a metal and/or a metal nitride by a sputtering process, an ALD process, a PVD process, or the like. The dielectric layer 454 may be formed of a metal oxide having a high dielectric constant (high-k), e.g., hafnium oxide (HfOx), zirconium oxide (ZrOx) or aluminum oxide (AlOx) by a CVD process or an ALD process.

Accordingly, a capacitor 460 including a lower electrode 452, a dielectric layer 454 and an upper electrode 456 may be formed in the first region A.

Figure 28:
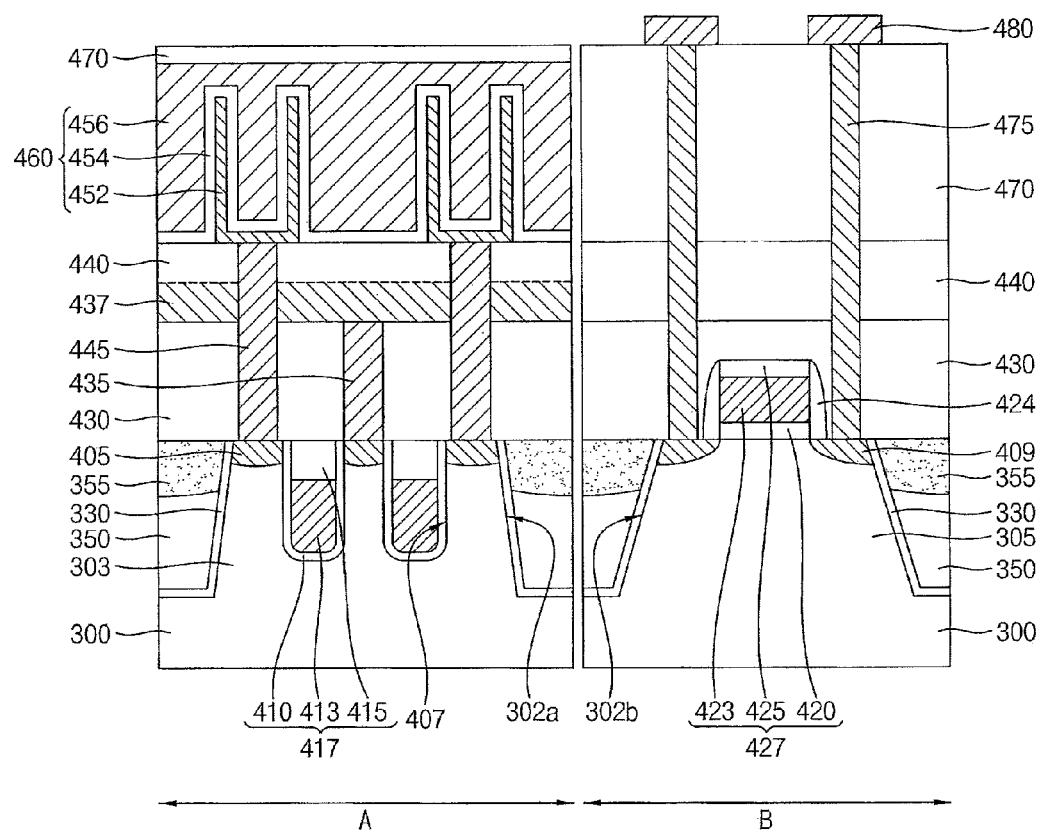

Referring to FIG. 28, the structure of FIG. 27 may be further modified by forming a third insulating interlayer 470 covering the capacitor 460 in the first region A and the second insulating interlayer 440 in the second region B. The third insulating interlayer 470 may be formed throughout the first region A and the second region B. Additionally, an upper surface of the third insulating interlayer 470 may be planarized by a CMP process.

A third contact 475 and a wiring 480 electrically connected to the peripheral circuit transistor may be formed in the second region B of the substrate 300. For example, a contact hole exposing the second impurity region 409 may be formed through the third insulating interlayer 470, the second insulating interlayer 440 and the first insulating interlayer 430. A conductive layer filling the contact hole may be formed on the third insulating interlayer 470, and an upper portion of the conductive layer may be planarized to form the third contact 475 electrically connected to the second impurity region 409. The wiring 480 electrically connected to the third contact 475 may be formed on the third insulating interlayer 470. The third contact 475 and the wiring 480 may serve as a portion of peripheral circuits.

In some embodiments, a passivation layer (not shown) including silicon nitride may be further formed on the capacitor 460 of the structure of FIG. 28.

According to exemplary embodiments as described above, a nitride liner may be omitted in the process of forming an isolation layer included in, e.g., a DRAM device. Therefore, an operational failure of a transistor occurring in a device region and/or a peripheral circuit region related to the presence of a nitride liner may be prevented, and an electrical reliability of the DRAM device may be improved. Further, an electrical property of the capacitor 460 may be also improved.

Additionally, a margin of an active pattern may increase as a result of being able to omit the nitride liner, and thus an area for the peripheral circuit region may be reduced.

According to exemplary embodiments of the present inventive concepts, a polysiloxane-based material may be used for the formation of an isolation layer instead of a polysilazane-based material. The polysiloxane-based material may be easily cured at a relatively low temperature and may contain a large amount of oxygen in its molecular structure, and thus may be easily transformed into an oxide layer by, e.g., a dry oxidation process. Therefore, a nitride liner that may be used for protecting a substrate in some similar fabrication processes may be omitted from the processes of the present invention concepts so that an operational failure caused by the nitride liner may be prevented.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. In the claims, means-plus-function clauses are intended' to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor device, comprising:
    forming a trench at an upper portion of a semiconductor substrate;
    forming a preliminary filling insulation layer by coating a siloxane composition on the semiconductor substrate to fill the trench;
    performing a low temperature curing process at a temperature in a range from about 50° C. to about 150° C. such that the preliminary filling insulation layer is transformed into a filling insulation layer including polysiloxane; and
    forming an isolation layer by planarizing the filling insulation layer.

2. The method of claim 1, further comprising a step of forming an oxide liner on an inner wall of the trench before forming the preliminary filling insulation layer.

3. The method of claim 2, wherein the step of forming the preliminary filling insulation layer includes coating the siloxane composition directly on the oxide liner.

4. The method of claim 2, wherein the step of forming the trench includes forming a first trench and a second trench, the second trench having a second trench width greater than a first trench width of the first trench,
    and also wherein the oxide liner fully fills the first trench, and extends along an inner wall profile of the second trench.

5. The method of claim 4, wherein the substrate includes a device region and a peripheral circuit region, and
    the first trench is formed at the device region and the second trench is formed at the peripheral circuit region.

6. The method of claim 1, wherein the siloxane composition includes a siloxane oligomer containing silicon-oxygen (Si—O) bonds.

7. The method of claim 6, wherein the siloxane oligomer is substantially devoid of silicon-nitrogen (Si—N) bonds.

8. The method of claim 1, wherein the low temperature curing process is performed at a temperature in a range from about 50° C. to about 100° C.

9. The method of claim 1, wherein, after the step of forming the isolation layer, the method further comprises:
transforming at least an upper portion of the isolation layer into a modified isolation layer having a silicate structure by a dry oxidation process.

10. The method of claim 9, wherein the dry oxidation process includes a plasma treatment or an ultraviolet treatment performed in an atmosphere substantially devoid of water vapor ($H_2O$).

11. A method of manufacturing a semiconductor device, comprising:
forming a trench at an upper portion of a semiconductor substrate;
forming a filling insulation layer that fills the trench and includes polysiloxane;
forming an isolation layer by planarizing the filling insulation layer; and
performing a dry oxidation process on at least an upper portion of the isolation layer; and,
further wherein the step of performing the dry oxidation process includes transforming at least the upper portion of the isolation layer into a modified isolation layer having a silicate structure.

12. The method of claim 11, wherein the dry oxidation process includes a plasma treatment or an ultraviolet treatment performed in an atmosphere substantially devoid of water vapor ($H_2O$).

13. The method of claim 11, wherein the step of forming the filling insulation layer includes:
forming a preliminary filling insulation layer that fills the trench and includes a siloxane oligomer or a siloxane prepolymer; and
performing a low temperature curing process at a temperature in a range from about 50° C. to about 150° C.

14. The method of claim 11, further comprising a step of forming an oxide liner on an inner wall of the trench before forming the filling insulation layer,
wherein the filling insulation layer and the isolation layer are formed directly on the oxide liner.

* * * * *